United States Patent
Suzuki (10) Patent No.: US 11,105,830 B2
(45) Date of Patent: Aug. 31, 2021

(54) VOLTAGE DETECTOR

(71) Applicant: ABLIC Inc., Chiba (JP)

(72) Inventor: Teruo Suzuki, Chiba (JP)

(73) Assignee: Ablic Inc., Chiba (JP)

( * ) Notice: Subject to any disclaimer, the term of this patent is extended or adjusted under 35 U.S.C. 154(b) by 18 days.

(21) Appl. No.: 16/799,155

(22) Filed: Feb. 24, 2020

(65) Prior Publication Data

US 2020/0292582 A1 Sep. 17, 2020

(30) Foreign Application Priority Data

Mar. 11, 2019 (JP) .............................. JP2019-043305

(51) Int. Cl.
*G01R 15/04* (2006.01)
*G01R 19/165* (2006.01)
*H03K 5/24* (2006.01)

(52) U.S. Cl.
CPC ....... *G01R 15/04* (2013.01); *G01R 19/16504* (2013.01); *H03K 5/2472* (2013.01)

(58) Field of Classification Search
None
See application file for complete search history.

(56) References Cited

U.S. PATENT DOCUMENTS

2014/0253069 A1\* 9/2014 Utsunomiya ........... G05F 1/565
323/273

FOREIGN PATENT DOCUMENTS

JP 2006-211297 A 8/2006

\* cited by examiner

*Primary Examiner* — Jas A Sanghera
(74) *Attorney, Agent, or Firm* — Crowell & Moring LLP (57) ABSTRACT

A voltage detector includes a first voltage detection circuit, a second voltage detection circuit, and a voltage divider circuit having a first node for providing a first divided voltage, and a second node for providing a second divided voltage. The second voltage detection circuit has a comparator circuit including a first input end connected to the first node and a second input end connected to a reference voltage. The first voltage detection circuit has a first NMOS transistor including a gate to which the second divided voltage is applied, and a constant current source with one end connected to the first NMOS transistor. The first NMOS transistor is configured to turn on in response to the second divided voltage being higher than a second threshold voltage and turn off in response to the second divided voltage being lower than the second threshold voltage.

4 Claims, 8 Drawing Sheets

VOLTAGE DETECTOR

RELATED APPLICATIONS

This application claims priority to Japanese Patent Application No. 2019-043305 filed on Mar. 11, 2019, the entire content of which is incorporated herein by reference.

BACKGROUND OF THE INVENTION

1. Field of the Invention

The present invention relates to a voltage detector.

2. Description of the Related Art

A voltage detector is generally connected to a power supply to monitor the fluctuation of the power-supply voltage. The voltage detector outputs a reset signal to a circuit connected to the power supply and driven by the power-supply voltage in response to the power-supply voltage fluctuation beyond a predetermined voltage. Upon receiving the reset signal, the circuit stops operation. Such a voltage detector is described, for example, in Japanese Patent Application Laid-Open No. 2006-211297.

The voltage detector described in Japanese Patent Application Laid-Open No. 2006-211297 includes a low-voltage detection circuit which outputs a reset signal in response to the voltage fall below a low-side reference level (VL), and a high-voltage detection circuit which outputs a reset signal in response to the voltage exceedance over a high-side reference level (VH). This voltage detector outputs the reset signal to reset the circuit in response to the power-supply voltage (Vo) fall below the low-side reference level (VL) and exceedance over the high-side reference level (VH).

However, in the voltage detector described above, since each of the high-voltage detection circuit and the low-voltage detection circuit includes a voltage divider circuit, a reference voltage circuit, and a comparator circuit, respectively, the number of circuits becomes large, resulting in high current consumption.

SUMMARY OF THE INVENTION

It is an object of the present invention to provide a voltage detector with low current consumption.

A voltage detector according to an embodiment of the present invention has a low-voltage detection circuit configured to detect a voltage lower than a first threshold voltage, a high-voltage detection circuit configured to detect a voltage higher than a second threshold voltage, and a voltage divider circuit configured to divide a monitoring voltage into a first divided voltage and a second divided voltage. The voltage divider circuit has a first node from which the first divided voltage is provided and a second node from which the second divided voltage is provided. One of the low-voltage detection circuit and the high-voltage detection circuit has a comparator circuit including a first input end connected to the first node and a second input end connected to a reference voltage, and the other of the low-voltage detection circuit and the high-voltage detection circuit has a first NMOS transistor including a gate to which the second divided voltage is supplied, and a constant current source with one end connected to the first NMOS transistor.

According to the present invention, since the number of circuits can be reduced, current consumption can be reduced.

DETAILED DESCRIPTION OF THE PREFERRED EMBODIMENTS

Voltage detectors according to the embodiments of the present invention will be described below with reference to the accompanying drawings. Each of the voltage detectors monitors a voltage of a monitoring target such as a power supply voltage to detect whether the voltage of the monitoring target is in a normal state within a predetermined voltage range, a low-voltage state lower than the predetermined voltage range, or a high-voltage state higher than the predetermined voltage range. In the case where an external circuit is connected to an output terminal of a voltage detector, the voltage detector outputs, to the external circuit, a signal based on the low-voltage state or the high-voltage state such as a reset signal at a transition to the low-voltage state or the high-voltage state.

First Embodiment

Figure 1:
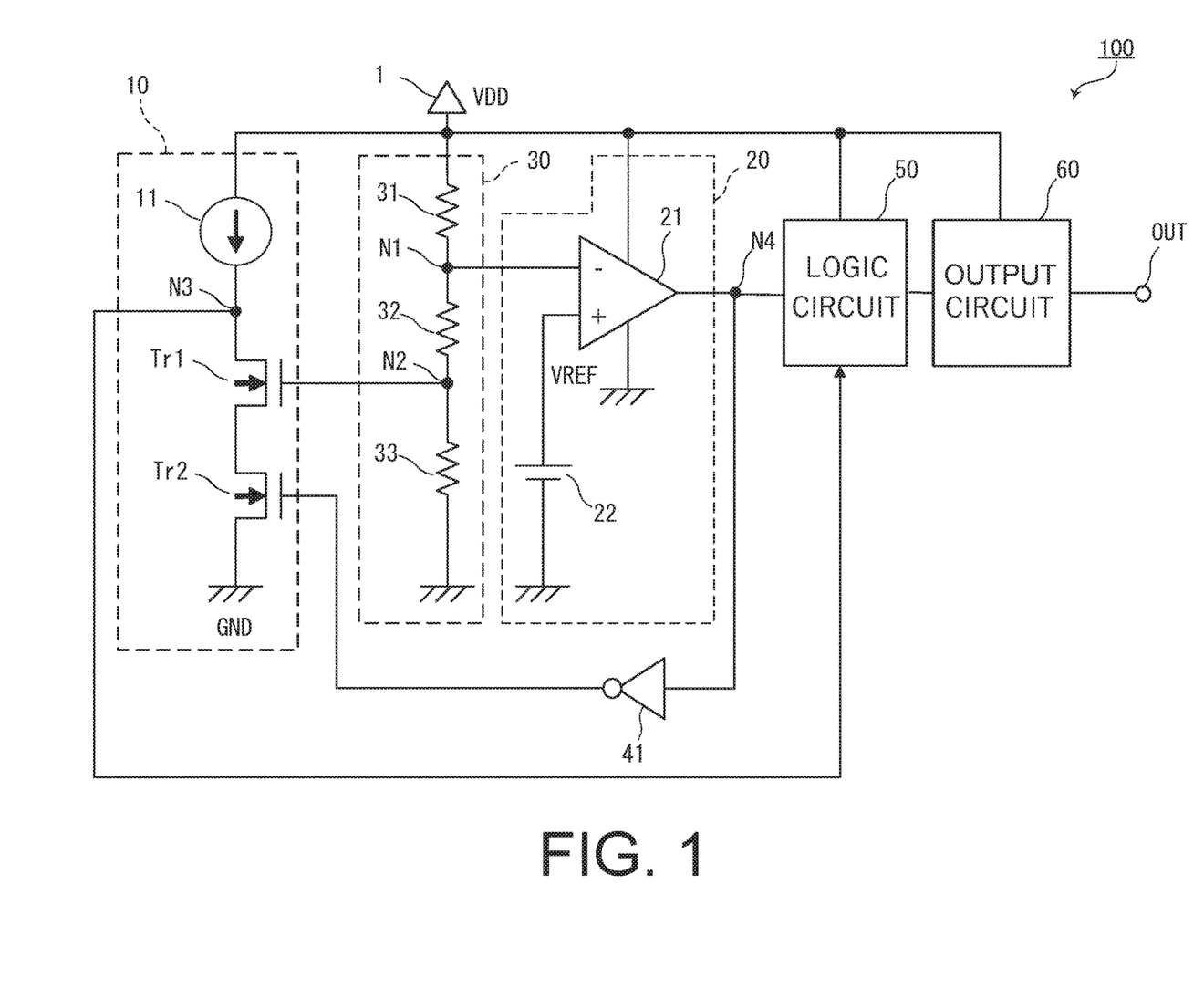
FIG. 1 is a circuit diagram of a voltage detector according to a first embodiment.

FIG. 1 is a circuit diagram of a voltage detector 100 according to the first embodiment of the present invention. The voltage detector 100 includes, for example, a first voltage detection circuit 10 as a high-voltage detection circuit, a second voltage detection circuit 20 as a low-voltage detection circuit, a voltage divider circuit 30, an inverter 41, a logic circuit 50, and an output circuit 60.

The first voltage detection circuit 10 has a constant current source 11 which supplies a constant current and the first and the second NMOS transistors Tr1, Tr2. The constant current source 11 and the first and the second NMOS transistors Tr1, Tr2 are connected between a power supply 1 and the earth as a ground node (hereinafter referred to as "GND"). The constant current source 11 is such that one end is connected to the power supply 1 and the other end is connected to the drain of the first NMOS transistor Tr1 The source of the first NMOS transistor Tr1 is connected to the drain of the second NMOS transistor Tr2. The source of the second NMOS transistor Tr2 is connected to GND. At the drain of the first NMOS transistor Tr1, a node N3 is set as an output end of the first voltage detection circuit 10.

The second voltage detection circuit 20 has a comparator circuit 21 and a reference voltage circuit 22 which supplies a reference voltage to the comparator circuit 21.

The comparator circuit 21 has two input ends composed of a non-inverting input terminal and an inverting input terminal, and one output end. On the output side of the comparator circuit 21, a node N4 is set as an output end of the second voltage detection circuit 20. The output end of the second voltage detection circuit 20 is connected at the node N4 to either one of two input ends of the logic circuit 50. The node N4 is connected to the gate of the second NMOS transistor Tr2 through the inverter 41.

The reference voltage circuit 22 has one end connected to the non-inverting input terminal of the comparator circuit 21 and the other end connected to GND.

The voltage divider circuit 30 is constructed by connecting a plurality of resistors in series for which three resistors 31, 32, 33 are shown as an example. One end of the resistor 31 is connected to the power supply 1, the other end of the resistor 31 is connected to one end of the resistor 32, the other end of the resistor 32 is connected to one end of the resistor 33, and the other end of the resistor 33 is connected to GND. A connection point at which the other end of the resistor 31 is connected to the one end of the resistor 32 is the first node N1. A connection point at which the other end of the resistor 32 is connected to the one end of the resistor 33 is the second node N2.

In the above configuration, the voltage divider circuit 30 divides the voltage between the power supply 1 and GND into a first divided voltage and a second divided voltage. In other words, the voltage divider circuit 30 has the first node N1 from which the first divided voltage can be tapped, and the second node N2 from which the second divided voltage can be tapped. The first node N1 is connected to the inverting input terminal as one of the two input ends of the comparator circuit 21. The second node N2 is connected to the gate of the first NMOS transistor Tr1.

The logic circuit 50 performs a predetermined logical operation based on an input signal and outputs high or low as the result of the operation. The logic circuit 50 has, for example, two input ends and one output end. The first input end as one of the two input ends of the logic circuit 50 is connected to the node N4, and the second input end is connected to the node N3. The output end of the logic circuit 50 is connected to an input end of the output circuit 60. The configuration of the logic circuit 50 can be selected appropriately from various configurations depending on the executable logical operation.

The output circuit 60 adjusts the input signal and provides an output signal in consideration of an external circuit (not illustrated) connected to the output terminal OUT of the voltage detector 100.

Figure 2:
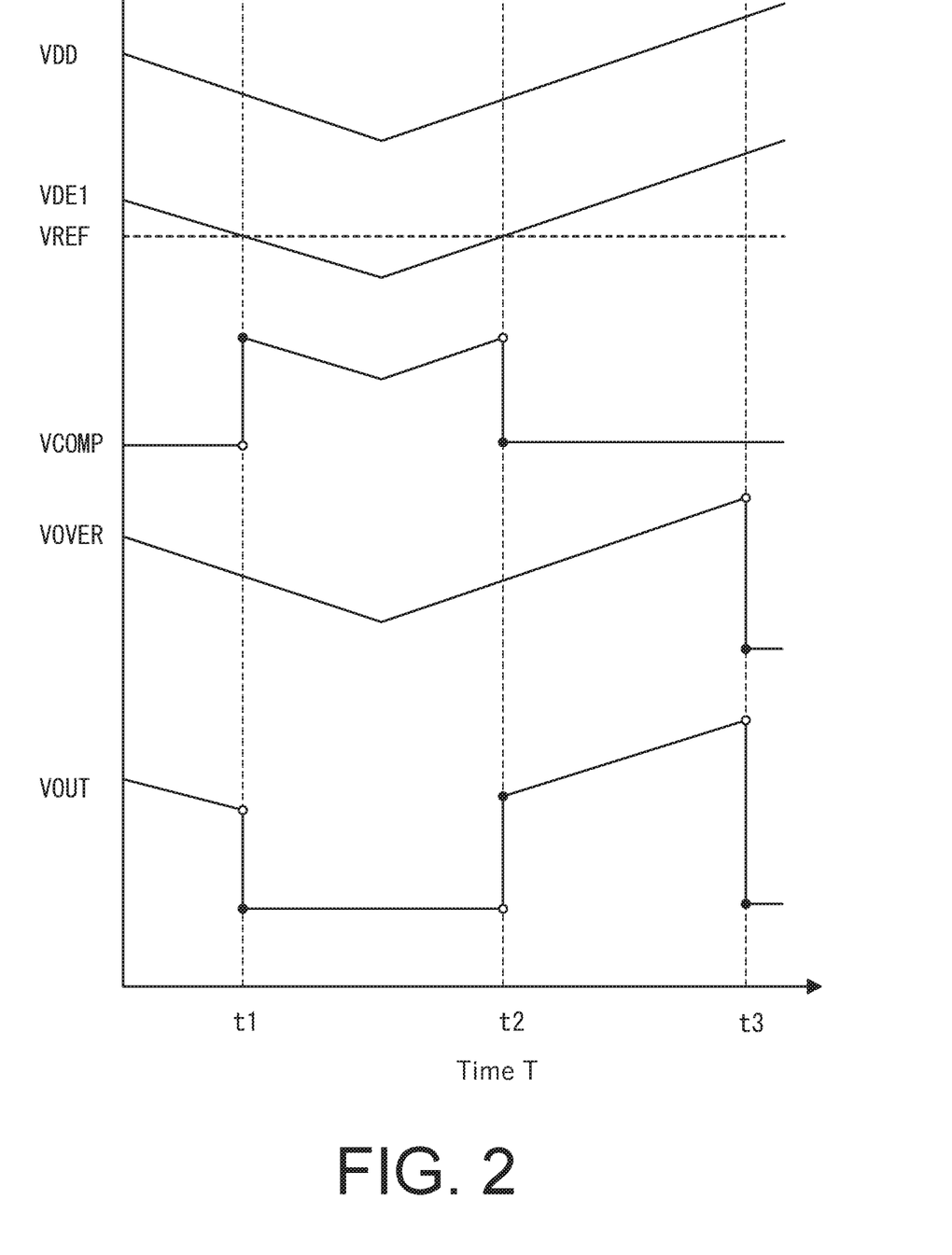
FIG. 2 is a timing chart of the voltage detector according to the first embodiment.
Figure 3:
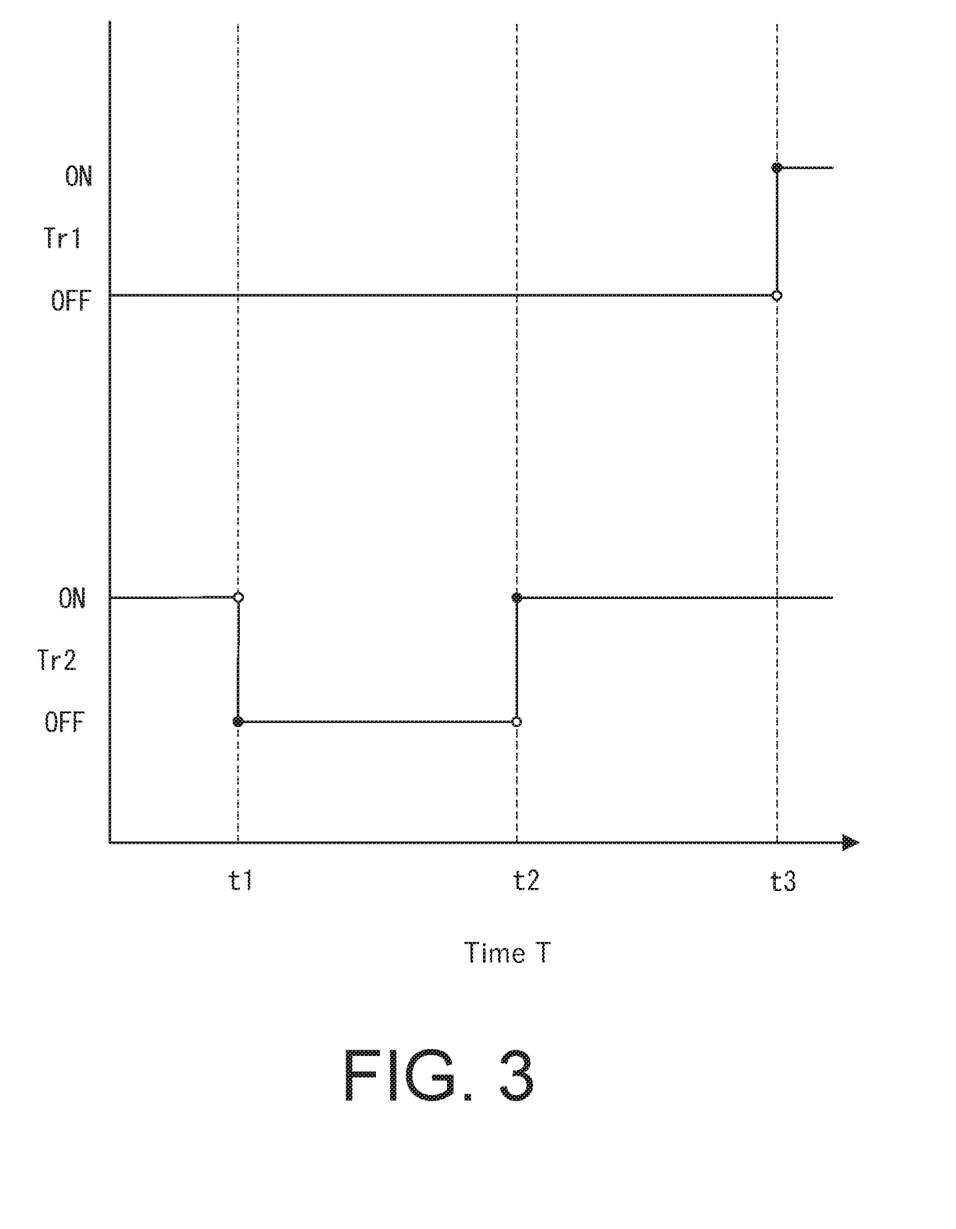
FIG. 3 is a timing chart of NMOS transistors in the voltage detector according to the first embodiment.

The action of the voltage detector 100 will next be described. FIG. 2 is a timing chart of voltages in the voltage detector 100 of FIG. 1. FIG. 3 is a timing chart of the first and the second NMOS transistors Tr1, Tr2.

In the timing chart of FIG. 2, the ordinate is relative value of respective voltage and the abscissa is time T. In FIG. 2 VDD is the power-supply voltage, VDE1 is the voltage at the node N1, VOVER is the voltage at the node N3, VCOMP is the voltage at the node N4, VREF is the reference voltage as an output voltage of the reference voltage circuit 22, and VOUT is the voltage at the output terminal OUT.

In the timing chart of FIG. 3, the ordinate is the operating state of each of the first and the second NMOS transistors Tr1, Tr2, and the abscissa is time T. Note that the time range on the abscissa in FIG. 3 is the same as the time range on the abscissa in FIG. 2, i.e., T=t1, t2, t3 on the abscissa in FIG. 3 coincide with T=t1, t2, t3 on the abscissa in FIG. 2.

In a normal state of VDD (T<t1), since VDE1 as the first divided voltage is higher than VREF as illustrated in FIG. 2 in the comparator circuit 21 of the second voltage detection circuit 20, VCOMP is low. In this case, a high voltage obtained by inverting VCOMP is applied to the gate of the second NMOS transistor Tr2. In the first voltage detection circuit 10, the first and the second NMOS transistors Tr1, Tr2 are in the off and on states, respectively, as illustrated in FIG. 3. This makes VOVER high to output a voltage proportional to VDD, i.e., a voltage having the same slope (voltage decrement per unit time) as VDD. Further, VOUT becomes high and a voltage proportional to VDD is supplied from the output terminal OUT.

Then, in the case where the power-supply voltage VDD decreases and transitions from the normal state to the low-voltage state (t1≤T<t2), VDE1 is lower than VREF as the first threshold voltage as illustrated in FIG. 2. In this case, in the second voltage detection circuit 20, VCOMP transitions from low to high at time T=t1. Further, in the first voltage detection circuit 10, the second NMOS transistor Tr2 is turned off at time T=t1 along with the transition of VCOMP as illustrated in FIG. 3. On the other hand, since the first NMOS transistor Tr1 maintains the off state, VOVER is kept high. Further, VOUT transitions to a low value along with the transition of VCOMP. The voltage detector 100 transmits the reset signal to an external circuit according to the transition of VOUT to low.

Then, in the case where the power-supply voltage VDD increases to return to the normal state from the low-voltage state (t2≤T<t3), VDE1 is higher than VREF at time T=t2 as illustrated in FIG. 2. VCOMP transitions to low since VDE1 is higher than VREF. The second NMOS transistor Tr2 is turned on at time T=t2 along with the transition of VCOMP as illustrated in FIG. 3. On the other hand, since the first NMOS transistor Tr1 maintains the off state, VOVER is kept high. VOUT transitions to high at time T=t2 along with the transition of VCOMP. The voltage detector 100 cancels the reset signal being transmitted to the external circuit according to the transition of VOUT to high.

Then, in the case where the power-supply voltage VDD further increases and transitions from the normal state to the high-voltage state (T≥t3), since VDE1 is higher than VREF after time T=t2 as illustrated in FIG. 2, VCOMP is kept low. Further, the first NMOS transistor Tr1 is turned on at time T=t3 as illustrated in FIG. 3. In other words, the voltage at the node N2 applied to the gate exceeds a threshold voltage of the first NMOS transistor Tr1 as a second threshold voltage. Here, VOVER transitions to low by setting the value of a sink current flowing through the first and the second NMOS transistors Tr1, Tr2 to a value larger than the current of the constant current source 11. VOUT transitions to low at time T=t3 along with the transition of VOVER. The voltage detector 100 transmits the reset signal to the external circuit by the transition of VOUT to the low value.

According to the first embodiment, since the first voltage detection circuit 10 and the second voltage detection circuit 20 share one voltage divider circuit 30, the circuit configuration can be simplified, and current consumption can be reduced without impairing the detection function for the low-voltage state and the high-voltage state. Further, since the voltage detector 100 has the first voltage detection circuit 10 having the configuration more simplified than that of the second voltage detection circuit 20, current consumption can be reduced. In other words, the operable duration can be prolonged without impairing the detection function for the low-voltage state and the high-voltage state even under a situation that the voltage detector 100 has to operate with limited power.

Second Embodiment

Figure 4:
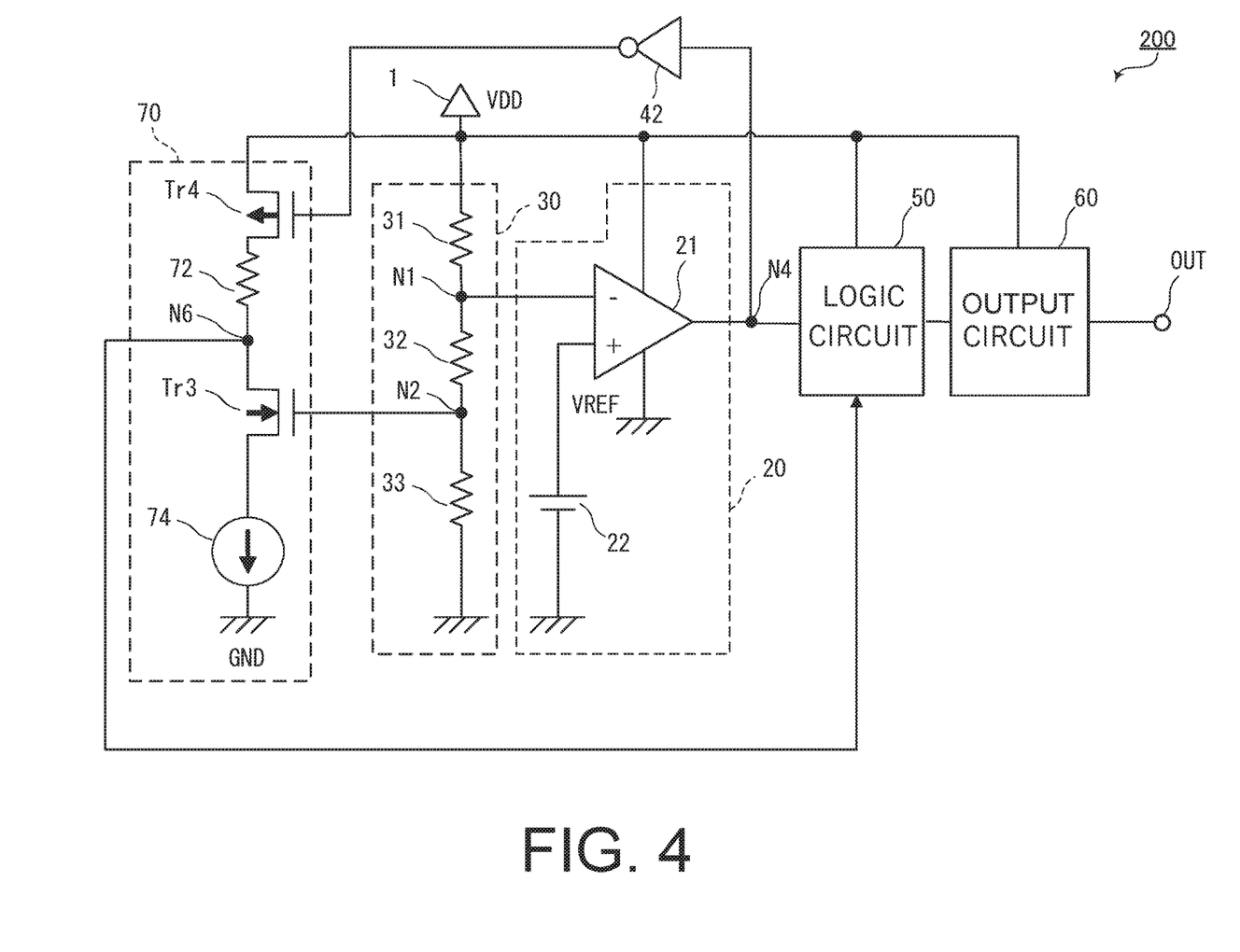
FIG. 4 is a circuit diagram of a voltage detector according to a second embodiment.

FIG. 4 is a circuit diagram of a voltage detector 200 according to the second embodiment of the present invention. The voltage detector 200 includes, for example, the second voltage detection circuit 20 as the high-voltage detection circuit, a third voltage detection circuit 70 as the low-voltage detection circuit, the voltage divider circuit 30, an inverter 42, the logic circuit 50, and the output circuit 60. The voltage detector 200 differs from the voltage detector 100 of FIG. 1 in that the third voltage detection circuit 70 is provided instead of the first voltage detection circuit 10 of FIG. 1, and that the third voltage detection circuit 70 detects a voltage lower than that detected by the second voltage detection circuit 20, but the other points are the same as those of the voltage detector 100 of FIG. 1. In the second embodiment, the third voltage detection circuit 70 will be mainly described to omit the duplicated description of the voltage detector 100.

The third voltage detection circuit 70 as the low-voltage detection circuit has, for example, a PMOS transistor Tr4, a resistor 72, an NMOS transistor Tr3, and a constant current source 74.

The PMOS transistor Tr4 has the source connected to the power supply 1 and the drain connected to one end of the resistor 72. The other end of the resistor 72 is connected to the drain of the NMOS transistor Tr3.

The source of the NMOS transistor Tr3 is connected to one end of the constant current source 74. The other end of the constant current source 74 is connected to GND. At the drain of the NMOS transistor Tr3, a node N6 as an output end of the third voltage detection circuit 70 is set. The output end of the third voltage detection circuit 70 is connected to a second input end of the logic circuit 50.

The gate of the PMOS transistor Tr4 is connected to the node N4 through the inverter 42. The gate of the NMOS transistor Tr3 is connected to the node N2 of the voltage divider circuit 30.

Figure 5:
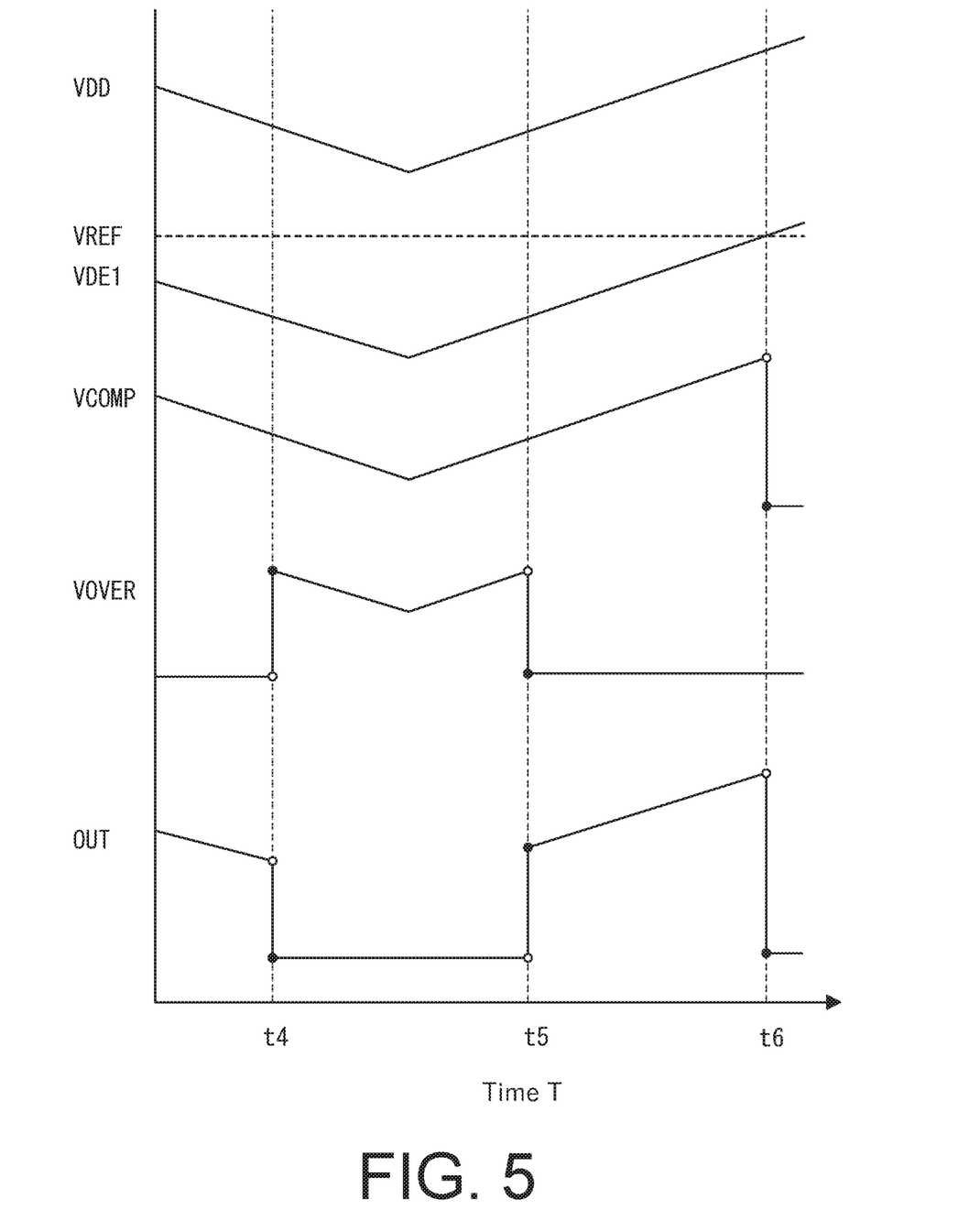
FIG. 5 is a timing chart of the voltage detector according to the second embodiment.
Figure 6:
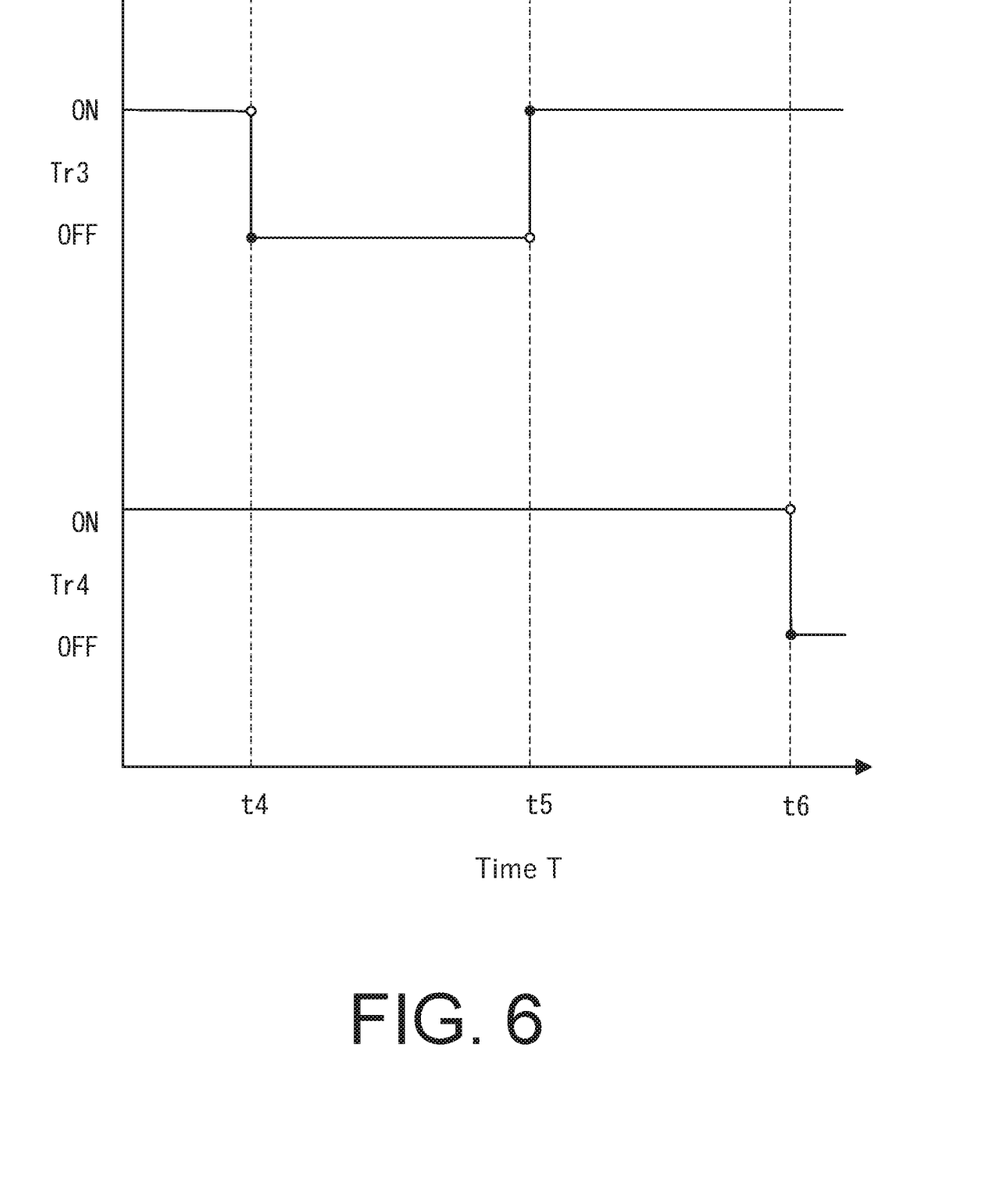
FIG. 6 is a timing chart of NMOS transistors in the voltage detector according to the second embodiment.

The action of the voltage detector 200 will next be described. FIG. 5 is a timing chart of voltages in the voltage detector 200 of FIG. 4. FIG. 6 is a timing chart of the NMOS transistor Tr3 and the PMOS transistor Tr4.

In the timing chart of FIG. 5, the ordinate is the voltage relative value of respective voltage and the abscissa is time T. Plotted in FIG. 5 are VDD, VDE1, VREF, VCOMP, and VOUT like in FIG. 2, and VOVER is the voltage at the node N6.

Note that FIG. 5 and FIG. 6 are similar to FIG. 2 and FIG. 3, respectively. In other words, T=t4, t5, t6 on the abscissa in FIG. 6 coincide with T=t4, t5, t6 on the abscissa in FIG. 5.

In the normal state of VDD (T<t4), since VDE1 is lower than VREF as illustrated in FIG. 5, VCOMP is high. In this case, a low voltage obtained by inverting VCOMP is applied to the gate of the PMOS transistor Tr4. The NMOS transistor Tr3 and the PMOS transistor Tr4 are both in the on state as illustrated in FIG. 6. In this case, since a voltage drop occurs by the flow of a current from the constant current source 74 into the resistor 72, VOVER is low. Since VOVER is low, VOUT becomes high to output a voltage proportional to VDD from the voltage detector 200.

Then, in the case where the power-supply voltage VDD further decreases and transitions from the normal state to the low-voltage state (t4≤T<t5), VDE1 is kept lower than VREF and VCOMP is kept high as illustrated in FIG. 5. Further, the NMOS transistor Tr3 transitions from the on state to the off state at time T=t4 as illustrated in FIG. 6. In other words, the voltage at the node N2 applied to the gate becomes lower than the threshold voltage of the NMOS transistor Tr3 as the second threshold voltage. On the other hand, since the PMOS transistor Tr4 maintains the on state, VOVER transitions from low to high at time T=t4. VOUT transitions to low along with the transition of VOVER. The voltage detector 200 transmits a reset signal to an external circuit according to the transition of VOUT to low.

Then, in the case where the power-supply voltage VDD increases and returns from the low-voltage state to the normal state (t5≤T<t6), since VDE1 remains lower than VREF, VCOMP is kept high. The NMOS transistor Tr3 transitions from the off state to the on state at time T=t5 as illustrated in FIG. 6. On the other hand, since the PMOS transistor Tr4 maintains the on state, VOVER transitions to low. Since VOVER transitions toe low, VOUT becomes high to output a voltage proportional to VDD from the voltage detector 200. The voltage detector 200 cancels the reset signal being transmitted to the external circuit according to the transition of VOUT to high.

Then, in the case where the power-supply voltage VDD further increases and transitions from the normal state to the high-voltage state (T≥t6), VDE1 becomes higher than VREF as the first threshold voltage at time T=t6 as illustrated in FIG. 5. VCOMP transitions to low since VDE1 is higher than VREF. Further, the PMOS transistor Tr4 is turned off at time T=t6 along with the transition of VCOMP as illustrated in FIG. 6. At this time, VOVER is kept low. VOUT transitions to low at time T=t6 along with the transition of VCOMP. The voltage detector 200 transmits the reset signal to the external circuit according to the transition of VOUT to low.

According to the second embodiment, since the third voltage detection circuit 70 and the second voltage detection circuit 20 share one voltage divider circuit 30, the circuit configuration can be simplified, and current consumption can be reduced without impairing the detection function for the low-voltage state and the high-voltage state. Further, since the voltage detector 200 has the third voltage detection circuit 70 having the configuration more simplified than that of the second voltage detection circuit 20, current consumption can be reduced. In other words, the operable duration can be prolonged without impairing the detection function for the low-voltage state and the high-voltage state even under a situation that the voltage detector 200 has to operate with limited power.

Note that the present invention is not limited to the above-described embodiments. Various modes other than the above-described examples can be carried out in the implementation phase, and various omissions, replacements, and changes are possible without departing from the scope of the invention. Such embodiments and variations thereof shall be included in the scope of the invention and included in the inventions and equivalents thereof as set forth in the scope of claims.

For example, a difference in inverted voltage may be set between the time of VDD decrease (for example, time T=t1 in FIG. 2) and the time of VDD increase (for example, time T=t2 in FIG. 2) to obtain VOUT. In other words, the voltage detectors according to the embodiments can have hysteresis.

Figure 7:
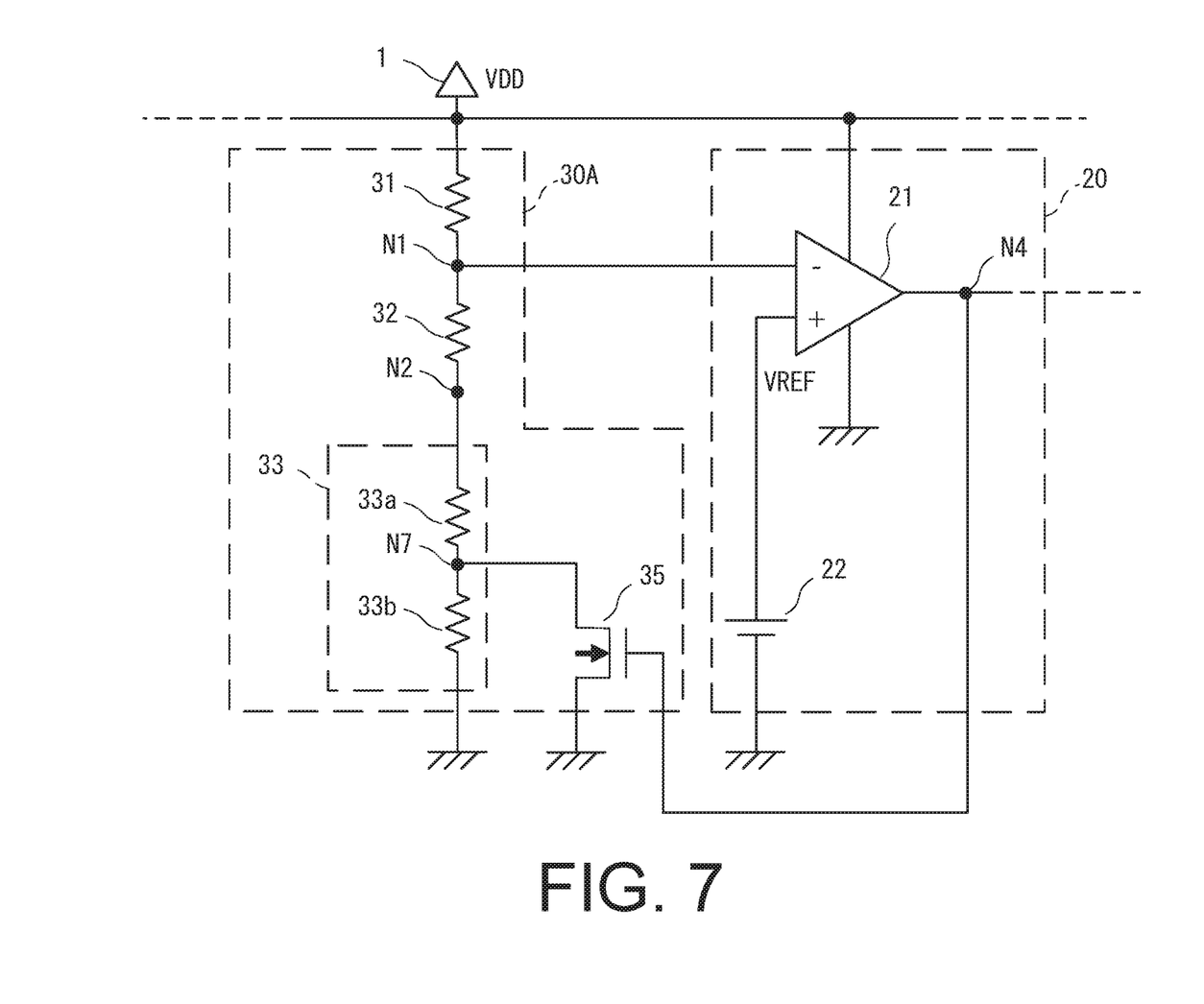
FIG. 7 is a partial circuit diagram illustrating a variation of the voltage divider circuit in the voltage detector according to the first embodiment.

For example, the configuration of a voltage detector having hysteresis can be achieved by the replacement of at least one of the resistors 31, 32, 33 (FIG. 1) with a variable resistor, or the addition of a switch to the voltage divider circuit 30 (FIG. 1). In this case, the switch may be an NMOS transistor 35 as illustrated in FIG. 7. In a voltage divider circuit 30A illustrated in FIG. 7, the resistor 33 is constructed by connecting a resistor 33a and a resistor 33b in series, and a node N7 as a connection point between the resistors 33a and 33b is connected to the drain of the NMOS transistor 35. Further, the source of the NMOS transistor 35 is connected to GND and the gate thereof is connected to the node N4.

Figure 8:
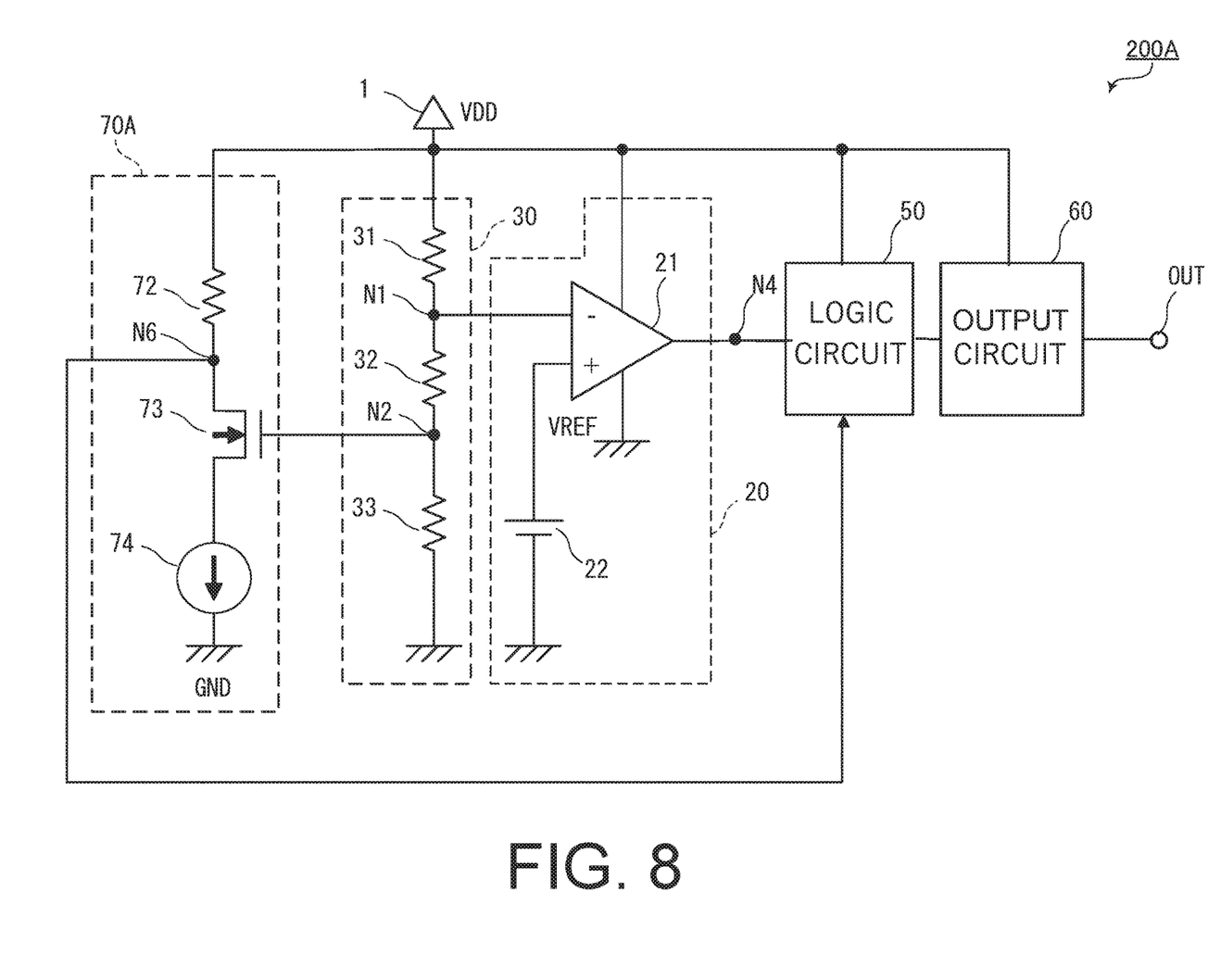
FIG. 8 is a circuit diagram illustrating a variation of the voltage detector according to the second embodiment.

As for the voltage detector 200 (FIG. 4), a voltage detector may be constructed by omitting the PMOS transistor Tr4 (FIG. 4) and the inverter 42 (FIG. 4). As illustrated in FIG. 8, a voltage detector 200A may be constructed to include a fourth voltage detection circuit 70A as a low-voltage detection circuit instead of the third voltage detection circuit 70 in the voltage detector 200 (FIG. 4). Although in the voltage detector 200A an error in VOVER (FIG. 5) after time T=t6 tends to be a little larger in a high-voltage direction, the configuration of a low-voltage detection circuit can be simplified.

Further, in the voltage detector 100, the inverter 41 is provided as a component independent of both the second voltage detection circuit 20 and the logic circuit 50, but the present invention is not limited thereto. The inverter 41 may be incorporated in either one of the second voltage detection circuit 20 and the logic circuit 50 only if the voltage supplied to the gate of the second NMOS transistor Tr2 is a voltage inverted to the output voltage of the comparator circuit 21. Like in the inverter 41 in the voltage detector 100, the inverter 42 in the voltage detector 200 may also be incorporated in either one of the second voltage detection circuit 20 and the logic circuit 50 in the same way.

Still further, the comparator circuit 21 may have hysteresis. Further, each of the voltage detectors 100, 200, and 200A may be constructed by omitting the output circuit 60.

What is claimed is:

1. A voltage detector, comprising:
a low-voltage detection circuit configured to detect a voltage lower than a first threshold voltage;
a high-voltage detection circuit configured to detect a voltage higher than a second threshold voltage; and
a voltage divider circuit configured to divide a monitoring voltage into a first divided voltage and a second divided voltage,
the voltage divider circuit having a first node configured to provide the first divided voltage and a second node configured to provide the second divided voltage,
one of the low-voltage detection circuit and the high-voltage detection circuit having a comparator circuit which includes a first input end connected to the first node and a second input end connected to a reference voltage, and
the other of the low-voltage detection circuit and the high-voltage detection circuit having a first NMOS transistor which includes a gate to which the second divided voltage is applied, and a constant current source with one end connected to the first NMOS transistor.

2. The voltage detector according to claim 1, wherein:
the low-voltage detection circuit is configured to detect, through the comparator circuit, that the first divided voltage is lower than the first threshold voltage;
the high-voltage detection circuit is configured to detect, through the first NMOS transistor and the constant current source, that the second divided voltage is higher than the second threshold voltage;
the constant current source has one end connected to a drain of the first NMOS transistor and the other end connected to a power supply;
the high-voltage detection circuit further comprises a second NMOS transistor having a drain connected to a source of the first NMOS transistor, a source connected to a ground node, and a gate to which a voltage obtained by inverting an output from the comparator circuit is applied, and an output end set at the drain of the first NMOS transistor; and
the first NMOS transistor turns on in response to the second divided voltage being higher than the second threshold voltage and turns off in response to the second divided voltage being lower than the second threshold voltage.

3. The voltage detector according to claim 1, wherein:
the high-voltage detection circuit is configured to detect, through the comparator circuit, that the first divided voltage is higher than the first threshold voltage;
the low-voltage detection circuit is configured to detect, through the first NMOS transistor and the constant current source, that the second divided voltage is lower than the second threshold voltage;
the other end of the constant current source is connected to a ground node;
the first NMOS transistor has a drain connected to a power supply through a resistor, a source connected to the one end of the constant current source, and the gate connected to the second node, and is configured to turn off in response to the second divided voltage being lower than the second threshold voltage, and turn on in response to the second divided voltage being higher than the second threshold voltage; and
the low-voltage detection circuit further has an output end set at the drain of the first NMOS transistor.

4. The voltage detector according to claim 3, further comprising:
a PMOS transistor connected between the power supply and the resistor, and having a source connected to the power supply, a drain connected to the drain of the first NMOS transistor through the resistor, and a gate to which a voltage obtained by inverting an output from the comparator circuit is applied.

* * * * *